United States Patent
Richter et al.

(10) Patent No.: US 7,878,283 B2
(45) Date of Patent: Feb. 1, 2011

(54) VEHICLE HAVING A THERMOELECTRIC GENERATOR

(75) Inventors: Rainer Richter, Munich (DE); Andreas Eder, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 12/501,724

(22) Filed: Jul. 13, 2009

(65) Prior Publication Data

US 2009/0272586 A1 Nov. 5, 2009

Related U.S. Application Data

(63) Continuation of application No. PCT/EP2008/000243, filed on Jan. 15, 2008.

(30) Foreign Application Priority Data

Feb. 3, 2007 (DE) .................. 10 2007 005 520

(51) Int. Cl.
*B60K 11/00* (2006.01)
(52) U.S. Cl. ..................... 180/68.1; 180/68.2
(58) Field of Classification Search .......... 180/68.1, 180/68.2, 68.3, 339, 54.1, 65.21; 429/13, 429/26; 60/320, 284; 123/193.5, 145 A
See application file for complete search history.

(56) References Cited

U.S. PATENT DOCUMENTS

| | | | |
|---|---|---|---|
| 2,362,259 A * | 11/1944 | Findley | ............... 126/110 E |
| 3,217,696 A | 11/1965 | Kiekhaefer | |
| 3,817,043 A | 6/1974 | Zoleta | |
| 3,899,359 A | 8/1975 | Stachurski | |
| 4,095,998 A | 6/1978 | Hanson | |
| 4,148,192 A | 4/1979 | Cummings | |
| 4,653,443 A * | 3/1987 | Fukazawa et al. | ....... 123/145 A |
| 4,673,863 A | 6/1987 | Swarbrick | |
| 5,625,245 A | 4/1997 | Bass | |
| 5,793,119 A * | 8/1998 | Zinke | ........................... 290/2 |
| 5,968,456 A * | 10/1999 | Parise | .......................... 422/174 |
| 5,974,803 A | 11/1999 | Hammerschmid | |
| 6,028,263 A | 2/2000 | Kobayashi et al. | |
| 6,029,620 A | 2/2000 | Zinke | |
| 6,509,552 B1 * | 1/2003 | Roske et al. | ................ 219/497 |
| 6,986,247 B1 * | 1/2006 | Parise | ........................... 60/284 |

(Continued)

FOREIGN PATENT DOCUMENTS

DE 41 18 979 A1 12/1992

(Continued)

OTHER PUBLICATIONS

German Search Report dated Oct. 23, 2007 including partial English translation (Nine (9) pages).
International Search Report dated Apr. 23, 2008 including English translation (Four (4) pages).

*Primary Examiner*—Han V Phan
(74) *Attorney, Agent, or Firm*—Crowell & Moring LLP

(57) ABSTRACT

A vehicle has a heat-emitting component and a thermoelectric generator, which has a heat-absorbing component thermally coupled with the heat-emitting component, and which generates electric energy from the temperature gradient between the heat-absorbing element and a heat sink. The thermoelectric generator is arranged directly on the heat-emitting component and is connected thereto in a thermally conductive manner.

18 Claims, 2 Drawing Sheets

U.S. PATENT DOCUMENTS

| | | | |
|---|---|---|---|
| 7,287,506 B1 * | 10/2007 | Reiners et al. | 123/193.5 |
| 7,405,013 B2 * | 7/2008 | Yang et al. | 429/13 |
| 7,523,607 B2 * | 4/2009 | Sullivan | 60/320 |
| 2003/0223919 A1 | 12/2003 | Kwak et al. | |
| 2004/0135550 A1 | 7/2004 | Nishihata et al. | |
| 2005/0172993 A1 * | 8/2005 | Shimoji et al. | 136/208 |

FOREIGN PATENT DOCUMENTS

| | | |
|---|---|---|
| DE | 42 08 358 A1 | 9/1993 |
| DE | 100 41 955 A1 | 3/2002 |
| DE | 10 2004 005 151 A1 | 9/2005 |
| DE | 10 2005 058 202 A1 | 6/2006 |
| DE | 10 2006 057 662 A1 | 6/2008 |
| EP | 1 647 717 A1 | 4/2006 |
| GB | 2 381 377 A | 4/2003 |
| GB | 2 392 776 A | 3/2004 |
| JP | 63-111268 A | 5/1988 |
| JP | 7-12009 A | 1/1995 |
| JP | 2003-7356 A | 1/2003 |
| WO | WO 2004/059138 A1 | 7/2004 |
| WO | WO 2005/020422 A1 | 3/2005 |
| WO | WO 2007/002891 A2 | 1/2007 |
| WO | WO 2007/032801 A2 | 3/2007 |

* cited by examiner

VEHICLE HAVING A THERMOELECTRIC GENERATOR

CROSS-REFERENCE TO RELATED APPLICATIONS

This application is a continuation of PCT International Application No. PCT/EP2008/000243, filed Jan. 15, 2008, which claims priority under 35 U.S.C. §119 to German Patent Application No. DE 10 2007 005 520.1, filed Feb. 3, 2007, the entire disclosures of which are herein expressly incorporated by reference.

BACKGROUND AND SUMMARY OF THE INVENTION

The present invention relates to a vehicle having a thermoelectric generator.

As used herein, the term "thermoelectric generator" indicates a system which is in a thermal connection with a heat source and a heat sink and which generates an electric voltage or an electric current from the temperature difference while utilizing the "Seebeck Effect" known from physics. In principle, the thermoelectric generator is therefore a Peltier arrangement operating in a physically opposite manner.

A thermoelectric generator has two different semiconductor materials which, similar to the schematic diagram of FIG. 2, are mutually connected in a thermally and electrically conductive manner. When this pairing of materials is subjected to a temperature difference between a heat source or a heat sink, an electric voltage (thermovoltage) is generated between the two material elements. By combining a large number of such elements, economically usable electric power can be achieved by means of a correspondingly efficient heat source.

Currently, approximately ⅔ of the energy in the form of heat contained in fuel is emitted to the environment in the case of modern road vehicles having an internal-combustion engine. There have already been a large number of approaches relating to the utilization of this "waste heat". In DE 10 2006 057 662.4, which is not a prior publication, a vehicle having a thermoelectric generator is described, which generator is arranged in the exhaust line and operates to convert a portion of the heat contained in the exhaust gas to electric energy. A large number of further publications relate to the utilization of energy contained in the exhaust gas, such as U.S. Pat. No. 4,673,863 A, DE 42 08 358 A1, DE 41 18 979 A1, JP 07012009 A, U.S. Pat. Nos. 5,625,245, 6,028,263 A, 5,974,803 and US 2003/0223919 A1, DE 100 41 955 A1, WO 2004/059138 A1, as well as WO 2005/020422 A1.

Furthermore, an arrangement is known from DE 10 2005 058 202 A1, in which waste heat of an engine is converted to electric energy by use of a thermoelectric generator, the thermoelectric generator being connected to the cooling water circuit of the engine.

It is an object of the invention to convert the residual heat stored in individual vehicle components to electric energy by use of a simply and compactly arranged thermoelectric generator, and to do so also when the vehicle is parked.

This object is achieved by a vehicle having a heat-emitting component and a thermoelectric generator, which has a heat-absorbing component thermally coupled with the heat-emitting component, and which generates electric energy from the temperature gradient between the heat-absorbing component and a heat sink. The thermoelectric generator is arranged directly on the heat-emitting component and is connected thereto in a thermally conductive manner. Advantageous embodiments and further developments of the invention are described herein.

According to the invention, a vehicle includes a "heat-emitting component" and a thermoelectric generator. The heat-emitting component may, for example, be the vehicle engine (internal-combustion engine) or its engine block or engine crankcase, the oil pan of the vehicle engine or another component of the engine that permits a good heat transfer. As an alternative, the heat-emitting component may also be a transmission, such as an automatic transmission, a manual transmission, an automated transmission, a transfer transmission, an axle transmission, or the like. The thermoelectric generator has a "heat-absorbing component" thermally coupled with the "heat-emitting component". The thermoelectric generator generates electric energy from the temperature gradient between the heat-absorbing element and a heat sink. The heat sink may be formed, for example, by the ambient air (air stream) or by a coolant of a coolant circuit to which the heat-absorbing element is connected.

An aspect of the invention consists of the fact that the thermoelectric generator with its heat-absorbing component is arranged directly on the heat-emitting component and is connected with the heat-emitting component in a thermally conductive manner. A good heat transfer is thereby achieved in a simple manner between the heat-emitting component and the heat-absorbing component of the thermoelectric generator. Preferably, the mutually adjoining surfaces of the heat-emitting component and of the heat absorbing component are each produced from a material having a high thermal conductivity. The heat-absorbing element of the thermoelectric generator could, for example, be made of copper.

The electric energy generated by the thermoelectric generator can be used for charging an electric energy accumulator, for example, a battery or a capacitor, provided in the vehicle, but also for directly supplying current to diverse electric consuming devices or loads provided in the vehicle, such as the audio system, the air conditioning system, the blower, etc.

According to a further development of the invention, it is provided that the electric energy generated by the thermoelectric generator is utilized for keeping an electric energy accumulator, for example, a battery or a capacitor provided in the vehicle, warm after the internal-combustion engine has been switched-off. For example, an electric heating device may be provided which, after the vehicle has been switched off, is supplied with electric energy by the thermoelectric generator and heats, for example, the battery at least for a certain time period, or keeps it warm.

As an alternative or in addition, the electric energy generated by way of the thermoelectric generator after the switching-off of the internal-combustion engine can also be used for keeping certain components warm whose operating temperature is relevant with respect to consumption when the internal-combustion engine is started again. Thus, by use of the electric energy generated by the thermoelectric generator after the switching-off of the internal-combustion engine, for example, the engine oil, or the cooling water can be heated, or consumption-relevant components, such as the crankshaft, the valve gear, the pistons, etc. can be heated or kept warm.

In summary, the following advantages may be achieved by way of the invention.

(a) A portion of the heat, which is released during the driving operation by way of the engine surface into the atmosphere (ambient air), can be converted to electric energy. As a result, operation of the generator is reduced and fuel is saved, which improves the energy balance of the vehicle.

(b) After parking the vehicle, the engine will cool down over a period of several hours. The heat stored in the engine block is released into ambient air by way of radiation and convection. By way of the thermoelectric generator, a portion of the heat stored in the engine can be converted to electric energy also when the vehicle is stationary.

In comparison to conventional approaches, in which the thermoelectric generator is integrated into the exhaust line, clearly lower technical risk exists when the thermoelectric generator is mounted on the engine block, on the transmission case, or on the axle transmission casing.

Compared with a thermoelectric generator integrated in the exhaust line, in the case of an arrangement directly on the engine, slight voltage fluctuations occur because of the slight temperature fluctuations of the hot side, which reduces the technical expenditures for smoothing the electric voltage.

Other objects, advantages and novel features of the present invention will become apparent from the following detailed description of one or more preferred embodiments when considered in conjunction with the accompanying drawings.

DETAILED DESCRIPTION OF THE DRAWINGS

Figure 1:
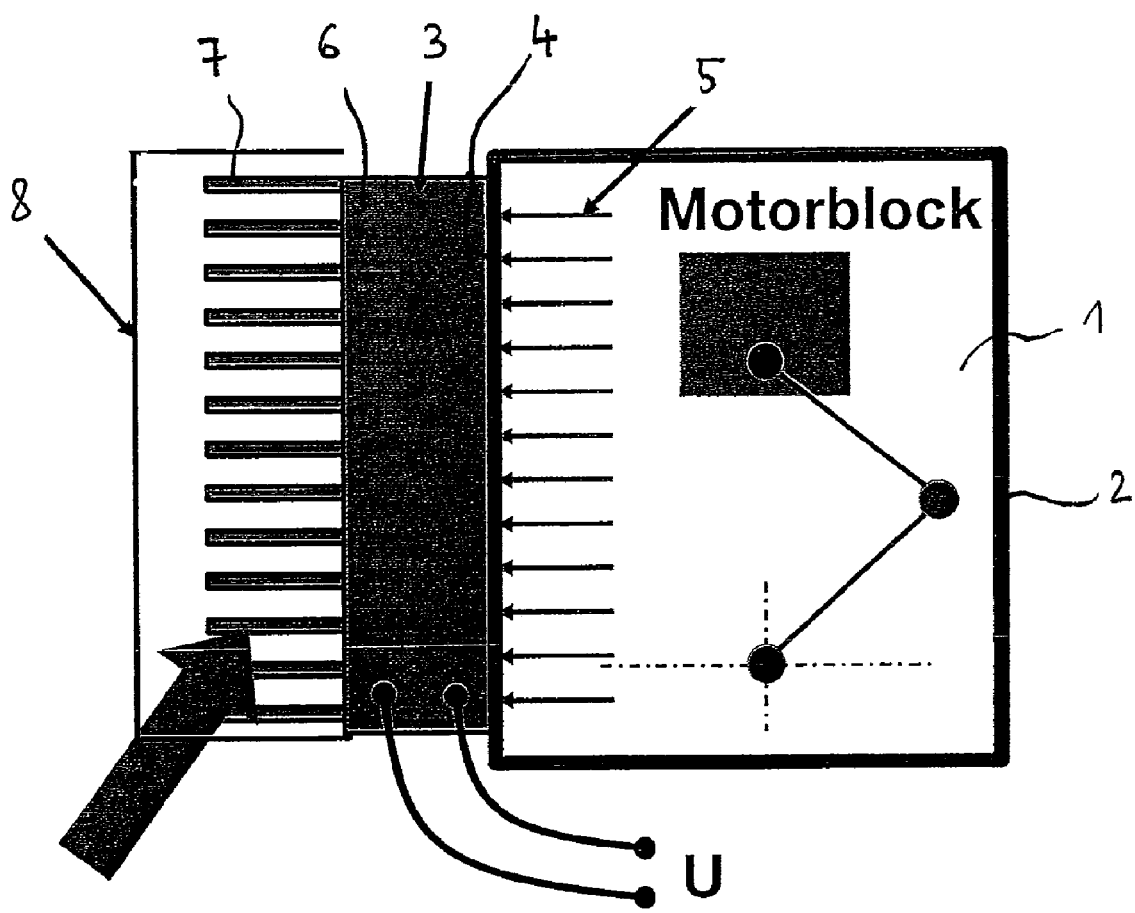
FIG. 1 is a schematic view of the basic principle of an embodiment of the invention.
Figure 2:
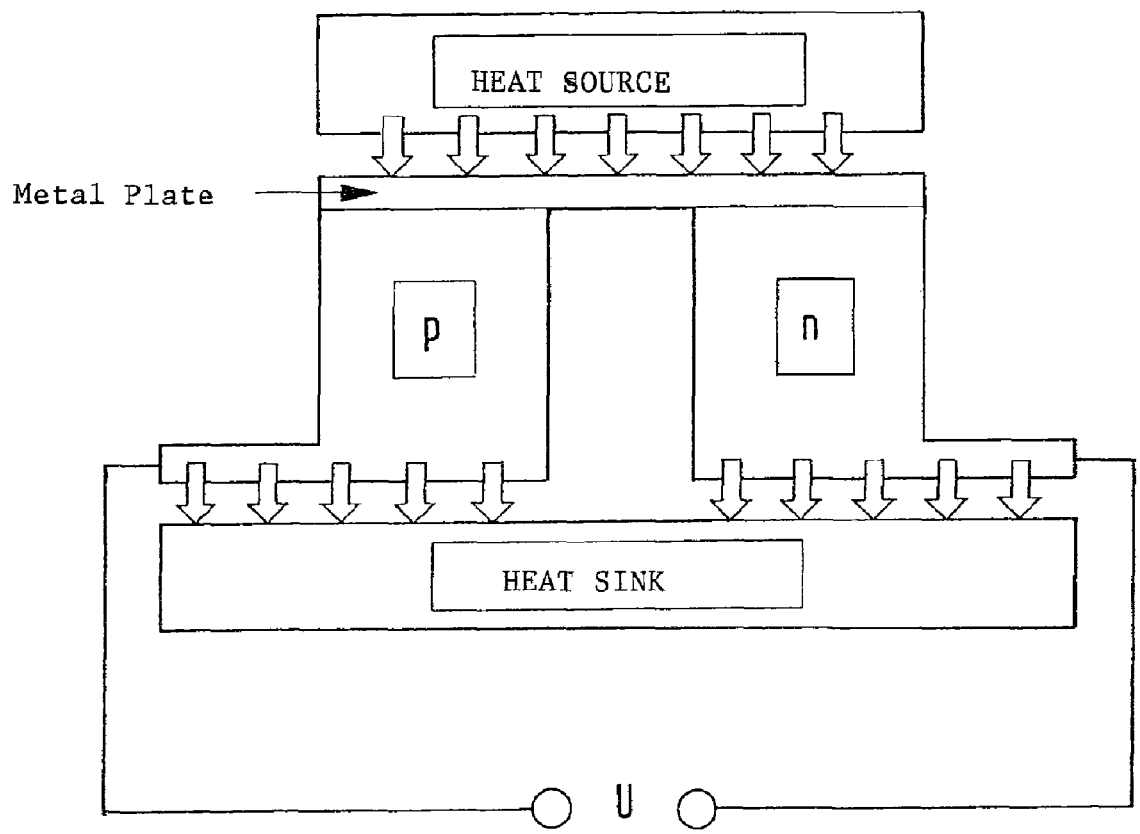
FIG. 2 is a view of the basic principle of a thermoelectric generator.

FIG. 1 illustrates an internal-combustion engine 1 having an engine block or an engine crankcase 2, on whose exterior side a thermoelectric generator 3 is arranged. The "heat-absorbing side" 4 of the thermoelectric generator 3 rests flatly against the engine crankcase 2, whereby a good heat transfer is achieved between the engine crankcase 2 and the heat-absorbing side 4 of the thermoelectric generator 3. The heat flow from the engine 1 to the thermoelectric generator 3 is symbolized by arrows 5.

The heat-emitting side 6 of the thermoelectric generator 3 is equipped with cooling ribs or fins 7. The heat-emitting side 6 and the cooling ribs 7 are shielded from thermal radiation of the internal-combustion engine by way of a metal shielding plate 8. Air flows around the cooling ribs 7 during driving of the vehicle. As a result, a good heat transfer is achieved from the thermoelectric generator 3 to the ambient air or to the air flow. In a known manner, an electric voltage U results from the temperature difference existing at the thermoelectric generator 3, which voltage U can be used as charging voltage for the electric on-board power supply system of the vehicle.

For optimizing the heat transfer from the thermoelectric generator 3 to the ambient air, the air flow can be channeled by way of an air conducting element (not shown) in a targeted manner in the direction of the cooling ribs 7. It is also contemplated to additionally provide an electric blower by which the cooling ribs 7 are additionally "ventilated".

Naturally, water cooling may also be used instead of air cooling of the thermoelectric generator 3. The heat-emitting side 6 of the thermoelectric generator or the cooling ribs connected therewith may, for example, be connected to a coolant circuit of the vehicle, in which case a coolant pump can be provided which pumps coolant to the cooling ribs and thereby further improves the heat removal.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A vehicle, comprising:
a heat-emitting component;
a thermoelectric generator, the thermoelectric generator comprising a heat-absorbing component thermally coupled with the heat-emitting component, the thermoelectric generator generating electric energy from a temperature gradient between the heat-absorbing component and a heat sink; and
a shielding element operably configured to shield the thermoelectric generator from thermal radiation released by the heat-emitting component,
wherein one side of the thermoelectric generator is arranged directly on an exterior surface of the heat-emitting component in a thermally conductive manner so as to be between the shielding element and the heat-emitting component.

2. The vehicle according to claim 1, wherein the heat-emitting component is an engine of the vehicle.

3. The vehicle according to claim 2, wherein the thermoelectric generator is arranged directly on a crankcase of the engine.

4. The vehicle according to claim 2, wherein the engine is an internal-combustion engine.

5. The vehicle according to claim 3, wherein the engine is an internal-combustion engine.

6. The vehicle according to claim 1, wherein the thermoelectric generator is arranged directly on an oil pan of the vehicle.

7. The vehicle according to claim 1, wherein the heat-emitting component is a transmission of the vehicle.

8. The vehicle according to claim 1, wherein the thermoelectric generator further comprises a thermoelectric generator heat-emitting component configured with cooling ribs.

9. The vehicle according to claim 8, wherein the thermoelectric generator heat-emitting component is arranged to have air flowing around or through said component during driving of the vehicle.

10. The vehicle according to claim 8, further comprising a blower operably arranged to blow cooling air to the thermoelectric generator heat-emitting component.

11. The vehicle according to claim 8, further comprising a liquid cooling circuit of the vehicle, the thermoelectric generator heat-emitting component being operably connected to the liquid cooling circuit.

12. The vehicle according to claim 1, further comprising an electric energy accumulator arranged in the vehicle, and being electrically coupled with the thermoelectric generator, wherein the electric energy generated by the thermoelectric generator charges the electric energy accumulator.

13. The vehicle according to claim 1, further comprising an on-board electric power supply system of the vehicle directly coupled with the thermoelectric generator, wherein the thermoelectric generator supplies the electric energy to individual loads arranged in the vehicle.

14. The vehicle according to claim 1, further comprising an electrically operable temperature control device, the temperature control device being supplied with electric energy via the thermoelectric generator, and after switching-off the vehicle, heating or keeping warm an electric energy accumulator of the vehicle.

15. The vehicle according to claim 14, wherein the temperature control device heats or keeps warm the electric energy accumulator in the form of a vehicle battery for a predetermined time period.

16. The vehicle according to claim 1, further comprising a temperature-control device, the temperature device being supplied with electric energy by the thermoelectric generator and, when an engine of the vehicle is switched-off, heats or keeps warm at least one operating liquid of the vehicle.

17. The vehicle according to claim 16, wherein the at least one operating liquid is an engine oil or a cooling water for the vehicle engine.

18. The vehicle according to claim 1, further comprising a temperature-control device, the temperature device being supplied with electric energy by the thermoelectric generator and, when an engine of the vehicle is switched-off, heats or keeps warm at least one individual component or assembly of the vehicle engine.

\* \* \* \* \*